(12) United States Patent
Bolken (10) Patent No.: US 7,557,454 B2
(45) Date of Patent: Jul. 7, 2009

(54) ASSEMBLIES WITH BOND PADS OF TWO OR MORE SEMICONDUCTOR DEVICES ELECTRICALLY CONNECTED TO THE SAME SURFACE OF A PLURALITY OF LEADS

(75) Inventor: Todd O. Bolken, Star, ID (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 11/182,160

(22) Filed: Jul. 15, 2005

(65) Prior Publication Data

US 2005/0248013 A1 Nov. 10, 2005

Related U.S. Application Data

(62) Division of application No. 10/093,332, filed on Mar. 7, 2002, now Pat. No. 6,955,941.

(51) Int. Cl.
*H01L 23/49* (2006.01)
*H01L 23/495* (2006.01)

(52) U.S. Cl. .............. 257/784; 257/E23.024; 257/E23.033; 257/E23.047; 257/E23.052; 257/E23.07

(58) Field of Classification Search ............. 257/784, 257/E23.024, E23.033, E23.047, E23.052
See application file for complete search history.

(56) References Cited

U.S. PATENT DOCUMENTS

| 5,012,323 | A | | 4/1991 | Farnworth | |
|---|---|---|---|---|---|
| 5,291,061 | A | | 3/1994 | Ball | |
| 5,331,235 | A | | 7/1994 | Chun | |
| 5,689,135 | A | * | 11/1997 | Ball | 257/676 |
| 5,804,874 | A | * | 9/1998 | An et al. | 257/676 |
| 5,960,262 | A | * | 9/1999 | Torres et al. | 438/123 |
| 6,087,718 | A | | 7/2000 | Cho | |
| 6,104,089 | A | | 8/2000 | Akram | |
| 6,175,149 | B1 | * | 1/2001 | Akram | 257/676 |
| 6,252,299 | B1 | | 6/2001 | Masuda et al. | |
| 6,303,981 | B1 | | 10/2001 | Moden | |
| 6,400,007 | B1 | * | 6/2002 | Wu et al. | 257/686 |
| 6,531,784 | B1 | * | 3/2003 | Shim et al. | 257/777 |
| 6,683,368 | B1 | * | 1/2004 | Mostafazadeh | 257/676 |
| 2001/0014488 | A1 | | 8/2001 | Akram | |
| 2002/0005575 | A1 | * | 1/2002 | Park et al. | 257/686 |
| 2002/0017722 | A1 | * | 2/2002 | Masuda | 257/724 |
| 2002/0096781 | A1 | * | 7/2002 | Toyosawa | 257/777 |
| 2002/0158316 | A1 | * | 10/2002 | Lee et al. | 257/676 |
| 2003/0127423 | A1 | | 7/2003 | Dlugokecki et al. | |

* cited by examiner

*Primary Examiner*—David Vu
*Assistant Examiner*—Earl N Taylor
(74) *Attorney, Agent, or Firm*—TraskBritt (57) ABSTRACT

A semiconductor device includes two or more semiconductor devices with bond pads that are electrically connected to the same, single surface of a plurality of leads. The two or more devices may include substantially centrally located bond pads or substantially identically arranged bond pads.

55 Claims, 7 Drawing Sheets

ASSEMBLIES WITH BOND PADS OF TWO OR MORE SEMICONDUCTOR DEVICES ELECTRICALLY CONNECTED TO THE SAME SURFACE OF A PLURALITY OF LEADS

CROSS-REFERENCE TO RELATED APPLICATION

This application is a divisional of application Ser. No. 10/093,332, filed Mar. 7, 2002, now U.S. Pat. No. 6,955,941, issued Oct. 18, 2005.

BACKGROUND OF THE INVENTION

1. Field of the Invention

The present invention relates generally to semiconductor die assemblies that employ multiple semiconductor dice. More specifically, the present invention relates to methods and apparatus for increasing integrated circuit density by employing a plurality of semiconductor dice in semiconductor assemblies utilizing single lead frames.

2. State of the Art

High performance, low cost, increased miniaturization of components, and greater packaging density of integrated circuits have long been the goals of the computer industry. Greater integrated circuit density, for a given level of active component and internal conductor density, is conventionally limited by the space available within a packaging envelope and by the surface area, or "real estate," available on a carrier substrate such as a printed circuit board.

In addition, simplicity and reduced processing of semiconductor die assemblies are preferable. For instance, reduction of parts and processing steps reduces the cost of semiconductor components. More specifically, it is preferable to plate one side of a package lead frame because plating more than one side adds cost and processing time to lead frame production. In addition, processing complexities may preclude plating the entire lead frame.

For conventional lead frame-mounted semiconductor dice, space limitations are a result of the basic design. Conventional lead frame design inherently limits potential single-die package density because the die-attach paddle of the lead frame is usually as large as or larger than the die residing on the paddle. The larger the die, the less space (relative to size of the die) that remains around the periphery of the die-attach paddle for bond pads for wire bonding. Furthermore, the inner lead finger ends on a lead frame may provide anchor points for the leads when the leads and the die are encapsulated, as with a filled polymer by transfer molding. These anchor points may be embodied as flanges or bends or kinks in the lead finger. As the sizes of packages approach the sizes of their dice therein, there is a corresponding reduction in the available encapsulant material depth along the sides of a package for the lead fingers to anchor to the encapsulant material and for the encapsulant material to provide a robust seal about and between the lead fingers. As a consequence of this reduction of the amount of encapsulant material into which the lead fingers may be encapsulated, anchored, and sealed, the encapsulant material may crack and destroy the package integrity, substantially increasing the probability of premature device failure, as the lead fingers (after encapsulation) are subjected to the normal stresses of trimming, forming and assembly with a carrier substrate, such as a printed circuit board.

One method of increasing integrated circuit density is to stack a plurality of dice vertically. U.S. Pat. No. 5,012,323 to Farnworth teaches combining a pair of dice mounted on opposing sides of a lead frame. An upper die is back-bonded to the upper surface of the leads of the lead frame via a first adhesively coated, insulated film layer. The lower die is face-bonded to the lower lead frame die-bonding region via a second, adhesively coated, insulative, film layer. The wire-bonding pads on both the upper die and lower die are interconnected with the ends of their associated lead extensions with gold or aluminum bond wires. The lower die is slightly larger than the upper die so that the lower die bond pads are accessible from above through an aperture in the lead frame such that wire bonds can be made from these bond pads to lead extensions. However, this arrangement has a major disadvantage from a production standpoint, since differently sized dice are required. Moreover, the lead frame design employed by Farnworth is directed toward peripherally located bond pads and includes a rather complex lead frame configuration, which may not be amenable to use in standard thin small outline packages (TSOPs).

U.S. Pat. No. 5,291,061 to Ball teaches a multiple stacked die device that contains up to four dice and which does not exceed the height of then-current single die packages. The low profile of the device is achieved by close-tolerance stacking which is made possible by a low-loop-profile wire bonding operation and thin-adhesive layers between the dice of the stack. However, although Ball secures all of the dice to a single lead frame, the bond pads of each die employed are peripherally located.

U.S. Pat. No. 5,804,874 to An et al. discloses the stacking of two or more identical leads-over-chip ("LOC") configured semiconductor dice facing in the same direction. A lower die is adhered by its active surface to leads of a lower lead frame and wire bonded in LOC fashion, after which the active surface of at least one other die is adhered to leads of an upper lead frame in LOC fashion, then adhesively back bonded to the upper surface of the lower lead frame. The leads of the upper lead frame are electrically connected to those of the lower lead frame by thermocompression bonding. The An device, while providing increased circuit density, requires at least two differently configured LOC lead frames and that bond pads of both dice be wire bonded to their corresponding leads before the at least two dice are secured together. Moreover, the asymmetrical die arrangement and coverage of the wire bonds of the lower die by the upper die may induce an irregular flow front of filled polymer encapsulant material as the assembly is encapsulated by transfer molding, resulting in incomplete encapsulation without voids and increased probability of bond wire sweep and consequent shorting.

U.S. Pat. No. 6,252,299 to Masuda et al. discloses an LOC-type semiconductor package wherein an upper die and a lower die, each with centrally located bond pads, are electrically connected to separate lead fingers of respective lead frames. In addition, the upper and lower dice are configured such that the circuit-bearing surfaces of each die are opposed to each other. Therefore, the Masuda invention employs multiple lead frames, which must be electrically isolated from one another, potentially increasing the thickness of the resulting package to an undesirable level.

U.S. Pat. No. 6,087,718, issued to Cho discloses a stacked-type semiconductor package wherein an upper die with peripherally located bond pads and a lower die with centrally located bond pads are electrically connected to a single lead frame. However, the use of differently configured semiconductor dice in Cho may be somewhat undesirable.

Thus, it would be advantageous to develop a technique and device for increasing integrated circuit density in the form of a TSOP-style semiconductor device assembly utilizing semiconductor dice with centrally located bond pads that are electrically bonded to the same surface of a single lead frame.

SUMMARY OF THE INVENTION

The present invention relates to methods and apparatus for increasing the integrated circuit density of a thin small outline package ("TSOP") and, in particular, to TSOP semiconductor die packages that include two semiconductor dice with centrally located bond pads in a stacked arrangement and that are electrically connected to a single, plated side of a common lead frame.

Substantially centrally located bond pad arrangements include, but are not limited to, bond pad arrangements wherein the bond pads are arranged in one or two straight lines, usually substantially aligned with and located near a lateral centerline of the semiconductor die. However, centrally located bond pad arrangements may also include so-called "I patterns" or other arrangements in which a substantial number of bond pads are located near or along the center or a lateral centerline of the semiconductor die.

In one embodiment, the present invention may include stacking a first die on a second die with a lead frame therebetween so that the active surfaces of the first and second dice are facing in substantially the same direction. The first die may be attached to the lead frame via adhesive-coated tape. Also, the lead frame lead fingers may be electrically connected to centrally located bond pads of the die at the inner lateral ends of the lead frame, as known in the art, such as by wire bonding or tape automated bonding ("TAB") processes. Further, a second die may be attached to the die assembly by dispersing epoxy over the lead frame surface, exposed active surface of the first die, and the aforementioned first electrical connections. The centrally located bond pads of the second die may electrically communicate with corresponding lead fingers of the lead frame by electrical connections that extend from the bond pad area of the second die, over the periphery of the second die to the lead frame surface (at least partially around the lateral surface of the second die) to which they are attached. As mentioned hereinabove, TAB bonding and wire bonding are examples of processes that may be utilized to electrically connect the bond pads of the second die to corresponding lead fingers of the lead frame.

Specifically concerning wire bonding, stitch bonding may be used to add rigidity to relatively long bond wires. Stitch bonding includes forming a series of bends in the bond wires to add rigidity to the wires. Thus, stitch bonding is employed in order to facilitate bonding operations, as well as decrease deflection during subsequent processes, such as encapsulation. Since bond wires that connect the second die to the lead frame in this embodiment extend substantially over a portion of the lateral extent of the second die, stitch bonding may be employed in the formation of longer bond wires to increase the rigidity thereof. Alternatively, stitch bonding may be implemented in order to tailor electrical characteristics of a bond wire. Particular electrical qualities related to length or the geometrical configuration of the bond wire may be implemented. More specifically, stitch bonding may alter the overall bond wire length, thereby affecting an electrical characteristic of the bond wire. Alternatively, a coil or other geometrical configuration may be employed in order to affect an electrical characteristic of the bond wire.

A TSOP semiconductor die assembly of the present invention may further include a dielectric packaging envelope that encapsulates the lead frame, as well as the first and second dice, with the primary lead fingers extending beyond the envelope. The packaging may be accomplished by way of a transfer molding process wherein mold cavities placed over the first and second semiconductor dice capture and form molten, filled polymer encapsulant around the semiconductor assembly, as known in the art. Following encapsulation, a trim and form operation is performed to remove excess portions of the lead frame as well as dam bars and to separate the packages from a lead frame strip into individual dual semiconductor die assemblies and appropriately configure outer ends of the primary lead fingers.

As a further consideration, the lead frame of the present invention may include a downset portion, wherein the lead fingers of the lead frame include one or more bends within the semiconductor package in order to adjust the point at which the lead fingers exit the package. Downsets may be employed to maintain consistent dimensions of the lead fingers external to the dielectric packaging so that standard TSOP handling equipment may be used.

In another embodiment, a die paddle that is not interposed between the semiconductor dice may be used to position the first die for electrical bonding to a lead frame. In this embodiment, the centrally located bond pads of the first semiconductor die are attached to the lead frame via conductive elements that extend from each bond pad laterally outwardly and connect to the lead frame external to the lateral extent of the first semiconductor die. Stitch bonding may be employed in the case of bond wires, since the bond wires would extend over about half of the lateral extent of the first die. The second die may be attached to the first die via epoxy or other attachment means, and the centrally located bond pads of the second die may be electrically connected to corresponding lead fingers of the lead frame by way of electrical connectors that extend to locations outside of the lateral extent of the second semiconductor die. Similar to the relatively long electrical connections of the first semiconductor die, if bond wires are used to connect the second semiconductor die to the lead frame, stitch bonding may be utilized. Alternatively, semiconductor dice with peripheral bond pad arrangements may be used with such a lead frame. As all of the electrical connections have substantially the same lengths, the electrical characteristics of the electrical connections, including the impedance thereof, may be substantially material.

Another embodiment of the semiconductor device assembly according to the present invention includes die assemblies wherein the active surfaces of each die face away from each other. A die paddle of a lead frame may be interposed between the semiconductor dice and an inner portion of each of the lead frame fingers may be formed in order to facilitate connection of both semiconductor dice to the same surface of the lead frame as well as allow for adjustment of lead lengths in order to substantially equalize electrical characteristics between individual electrical connection elements between a bond pad and the lead frame.

In an additional embodiment, the active surfaces of both dice may be oriented so as to face one another. A lead frame that interposes between the first semiconductor die and the second semiconductor die may be used. Unique to this embodiment, electrical connections from the bond pads of the second semiconductor die to the lead frame are formed between the active surface of the second semiconductor die and the surface of the lead frame attached thereto. Therefore, it may be advantageous to form the electrical connection elements prior to attachment thereof to the second semiconductor die and, upon securing the second semiconductor die to the first semiconductor die and the lead frame, electrically connect the electrical connection elements to the lead frame.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate what are currently considered to be best modes for carrying out the invention.

DETAILED DESCRIPTION OF THE INVENTION

The TSOP semiconductor assembly of the present invention increases integrated circuit density by providing a stacked dice configuration. Further, the present invention provides higher circuit density for first and second dice that include centrally located bond pads. Also, the present invention improves the rigidity of relatively long bond wires by way of stitch bonding. Finally, and without limitation, attachment of two semiconductor dice to a common lead frame facilitates manipulation of the assembly for attachment of the offset lead frame and electrical connection elements and reduces the potential for damage to the assembly.

Exemplary embodiments of the present invention will be hereinafter described with reference to the accompanying drawings. It should be understood that the illustrations are not meant to be actual views of any particular apparatus and/or method, but are merely idealized representations which are employed to more clearly and fully depict the present invention than would otherwise be possible. Additionally, elements and features common between the figures retain the same numerical designation.

Figure 1:
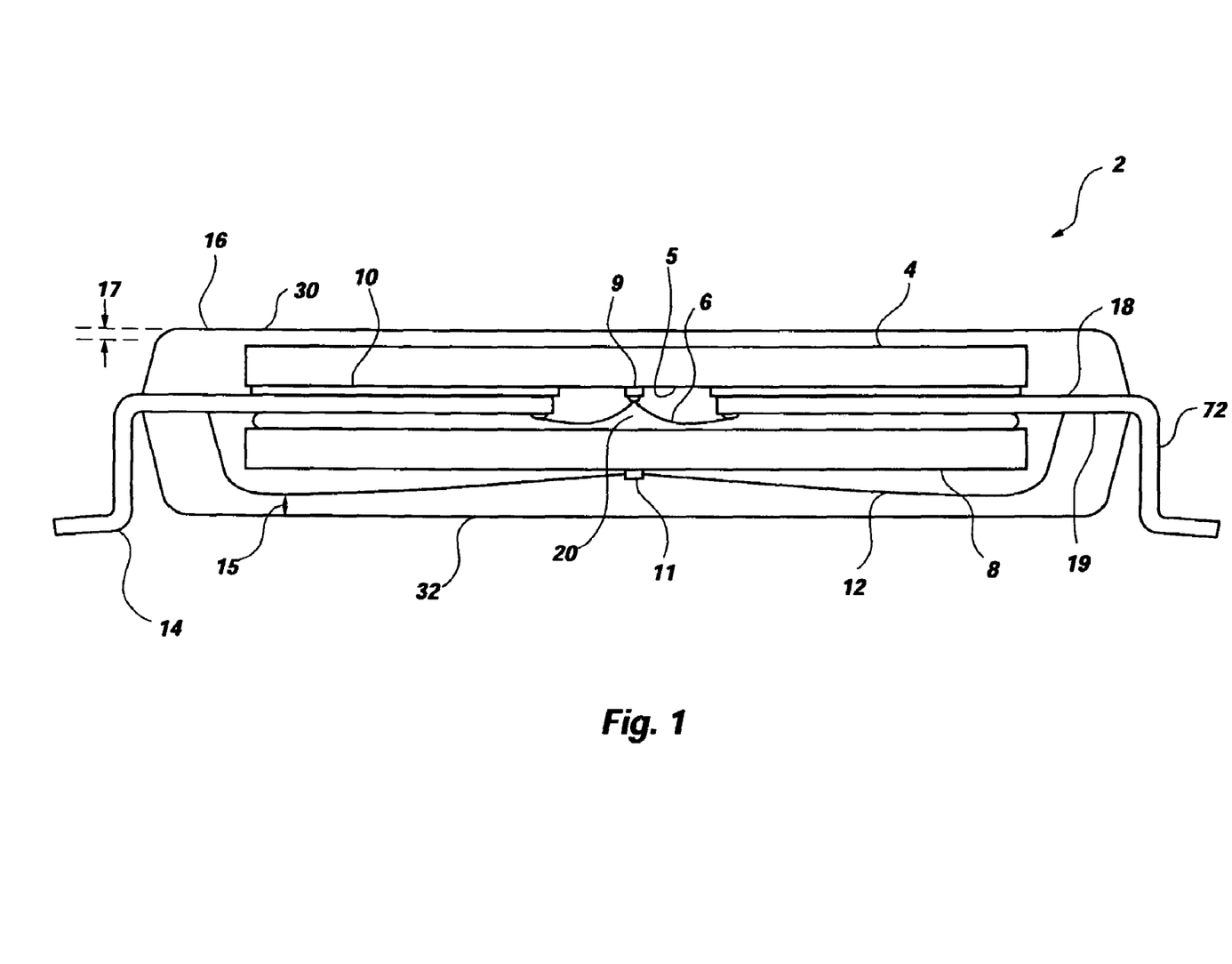
FIG. 1 is a simplified cross-sectional view illustrating an embodiment of a packaged, dual, centrally bonded TSOP semiconductor die assembly according to the present invention that includes a leads-over-chip-(LOC-) type lead frame and two semiconductor devices with centrally located bond pads on opposite sides thereof.

As shown in FIG. 1, TSOP semiconductor die package 2 contains a first semiconductor die 4 and a second semiconductor die 8, which are each electrically connected to the same lead frame 14.

Both first semiconductor die 4 and second semiconductor die 8 respectively include bond pads 9, 11 that are positioned at or near the centers or centerlines of active surfaces thereof. Lead frame 14 has a first surface 18 and a second surface 19.

Second surface 19 of lead frame 14 may be plated to enhance bonding of electrical connection elements 6, 12 to the lead frame 14. For instance, a nickel-gold alloy may be used to enhance bonding of electrical connection elements 6,12 to the surface of lead frame 14. Electrical connection elements 6 that extend from the substantially centrally located bond pads 9 of first semiconductor die 4 are attached to second surface 19 of lead frame 14. Likewise, electrical connection elements 12 electrically connect the substantially centrally located bond pads 11 of second semiconductor die 8 to the same second surface 19 of lead frame 14. Electrical connection elements 6, 12 used to attach the substantially centrally located bond pads 9,11 of each respective semiconductor die 4, 8 to lead frame 14 may comprise bond wires, conductive TAB elements carried by a dielectric film, bonded leads, or other electrical connection structures, as known in the art.

Referring to FIG. 1, TSOP semiconductor die package 2 may be assembled by affixing first semiconductor die 4 to first surface 18 of the lead frame 14 by way of an adhesive material, such as an epoxy or a pressure-sensitive, adhesive-coated tape 10 as depicted, or as otherwise known in the art. Lead fingers 72 extend over an active surface 5 of first semiconductor die 4 to locations proximate corresponding bond pads 9. The substantially centrally located bond pads 9 of first semiconductor die 4 may be electrically connected to second surface 19 of corresponding lead fingers 72 at locations thereof which are proximate to bond pads 9 by way of electrical connection elements 6 positioned between bond pads 9 and their corresponding lead fingers 72. Electrical connection elements 6 of gold, aluminum or suitable alloys thereof may be secured into place between the lead fingers 72 of the lead frame 14 and substantially centrally located bond pads 9 on first semiconductor die 4 by any suitable technique. For example, wire bonding in the form of ultrasonic bonding, thermocompression bonding, or thermosonic bonding may be used to secure electrical connection elements 6 into place.

Epoxy 20 may be applied to second surface 19 of lead frame 14, as well as around electrical connection elements 6 and over the exposed surface of first semiconductor die 4, including substantially centrally located bond pads 9 thereon. Second semiconductor die 8 may then be placed onto the epoxy 20, thus affixing second semiconductor die 8 to first semiconductor die 4. Epoxy 20 may be at least partially uncured to facilitate adhesion of second semiconductor die 8 to first semiconductor die 4. Following proper positioning of second semiconductor die 8, either before or after bond pads 11 thereof are electrically connected to corresponding lead fingers 72 of lead frame 14, epoxy 20 may be substantially cured, as known in the art (e.g., thermally, with a catalyst, by radiation of a particular type or of a particular wavelength, etc.). As shown in FIG. 1, first semiconductor die 4 and second semiconductor die 8 face in substantially the same direction. Substantially centrally located bond pads 11 of second semiconductor die 8 may be electrically connected to lead frame 14 by way of electrical connection elements 12 that extend between bond pads 11 and regions of their corresponding lead fingers 72 that are laterally exposed beyond the outer periphery of second semiconductor die 8. Electrical connection elements 12 extend to lead frame 14 from the substantially centrally located bond pads 11 of second semiconductor die 8 laterally outward and around the lateral edge of second semiconductor die 8, contacting and electrically connecting to second surface 19 of lead frame 14.

Figure 6:
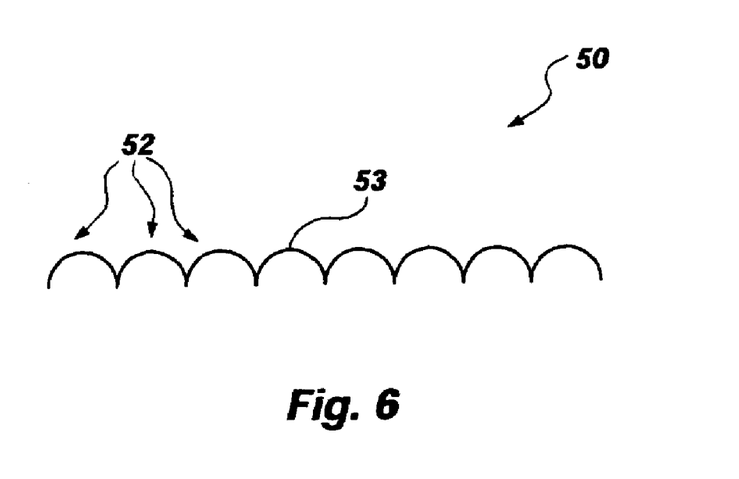
FIG. 6 is a simplified side view illustrating an embodiment of stitch bonding wire according to the present invention.
Figure 7:
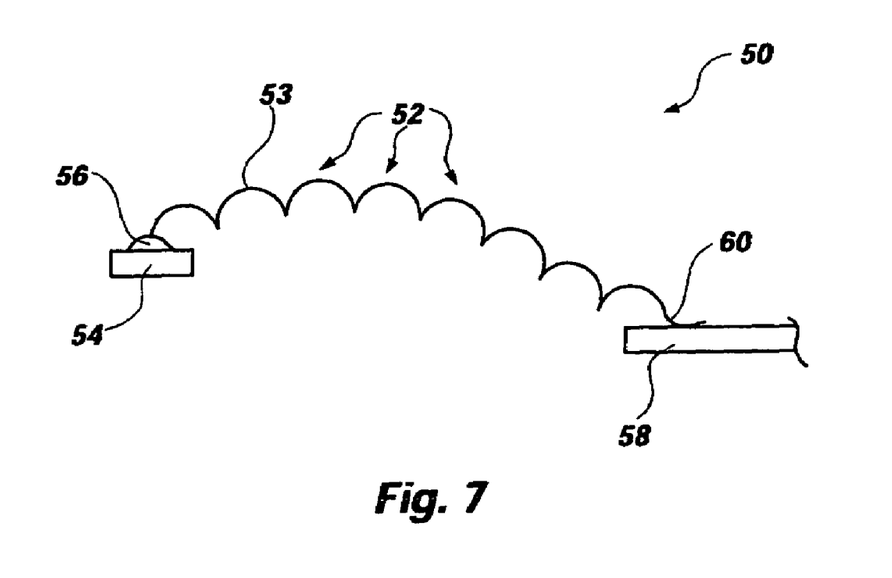
FIG. 7 is a simplified side view illustrating an embodiment of a wire bond between two bond pads utilizing stitch bonding according to the present invention.

If electrical connection elements 12 comprise bond wires, it may be desirable to stiffen the bond wires by way of stitch bonding the electrical connection elements 12 that are relatively long. Stitch bonded bond wires include a series of bends to increase the stiffness of the bond wires. FIG. 6 illustrates one embodiment for stitch bonding 50 where a bond wire 53 is configured with a plurality of bends 52. FIG. 7 illustrates a stitch bonded wire 50 where bond wire 53 initiates at bond pad 54 by way of bonding bump 56 and extends, configured with bends 52, to lead finger 58, wherein a side bond 60 attaches the bond wire 53 thereto. Although bends 52 have been generally depicted as primarily vertical semicircular representations, the present invention is not to be so limited, as many other configurations are possible and contemplated by the present invention. For instance, it is contemplated that the present invention includes stitch bonding in the form of bends that are configured to be sinusoidal, triangular, square, rectangular, helical, tapered, or otherwise configured to increase the stiffness of the bond wire. Further, stitch bonding may be used to impart a bond wire with particular electrical characteristics. Since stitch bonding generally increases the overall length of the bond wire (as compared to a relatively straight bond wire that extends the same distance), an electrical characteristic of a bond wire may be modified. In addition, stitch bonding configured as a coil or otherwise may affect an electrical characteristic as well. Specifically, a coiled bond wire and a substantially straight bond wire may exhibit differing inductance characteristics.

First semiconductor die 4 and second semiconductor die 8 may have, but are not limited to having, the same dimensions, the same type of circuitry, and the same configuration. However, each semiconductor die 4, 8 is configured with substantially centrally located bond pads. In addition, although the embodiment shown in FIG. 1 utilizes epoxy 20 to attach second semiconductor die 8 to first semiconductor die 4 and lead frame 14, other attachment mechanisms may be used. For instance, second semiconductor die 8 may be attached to the lead frame 14 by way of adhesive tape. However, a pillow of epoxy 20 may be preferred since electrical connection elements 6 may be encapsulated by epoxy 20 and protected therein and since epoxy 20 could have substantially the same coefficient of thermal expansion as a polymer encapsulant material for the entire assembly. Further, the present invention contemplates combinations of epoxy with adhesive tape, or other attachment means.

In the exemplary semiconductor die package 2 illustrated in FIG. 1, from top to bottom thereof, upper encapsulant thickness 17 is about 0.224 mm, first and second semiconductor dice 4 and 8 have thicknesses of about 0.2 mm each, the spacing between first and second semiconductor dice 4 and 8 is about 0.2 mm (and includes adhesive-coated tape 10, which has a thickness of about 0.05 mm, lead frame 14, which has a thickness of about 0.1 mm, and epoxy 20), and lower encapsulant thickness 15 between electrical connection elements 12 and semiconductor die package 2 is about 0.185 mm. Accordingly, semiconductor die package 2 has a total thickness of about one millimeter.

Upon fabrication of the previously described assembly of lead frame 14 with attached first and second semiconductor dice 4 and 8, the assembly may be encapsulated for protection from physical damage and environmental contamination. The encapsulation process used may be any suitable known encapsulation process and may comprise a transfer molding process, as known in the art. Typically, a transfer mold having a plurality of die cavities is placed surrounding the die assembly. The transfer molding process encapsulates the nonactive surface of first semiconductor die 4 as well as the active surface of second semiconductor die 8, including substantially centrally located bond pads 11, in an encapsulant package 16. The encapsulant may comprise, but is not limited to, a particulate-filled, thermosetting polymer, although pot molding compounds and processes and thermoplastic mold materials and injection molding processes may also be used, as may other encapsulation techniques that are known in the art. In order to avoid damaging the die assembly, the encapsulant depth may extend an adequate distance (e.g., 12 μm or more) beyond electrical connection elements 12. If epoxy 20 that secures second semiconductor die 8 to first semiconductor die 4 has not been fully cured prior to encapsulation, epoxy 20 may be substantially cured as the encapsulant material is cured (e.g., by heat and/or pressure, etc.).

In addition, encapsulant package 16 may be marked on its outer surface by way of laser marking. In such a case, the laser marking may comprise engraved characters extending below the surface of the encapsulant. Therefore, the encapsulant thickness 15, 17 should be adequate to accommodate such laser marking while providing the desired protective barrier between electrical connection elements 12 and the external environment.

Significantly, the TSOP semiconductor die package 2 is substantially the same size as a typical single die TSOP. For example, the TSOP of the present invention may exhibit a cross-sectional thickness, from upper surface 30 to lower surface 32 of encapsulant package 16, of about 0.99 mm. In order to achieve this package size, each first semiconductor die 4 and second semiconductor die 8 may be back-ground by way of mechanical surface grinding or other known techniques to a thickness of about 0.2 mm. Thus, the present invention increases integrated circuit density in the form of a TSOP semiconductor device assembly using semiconductor dice 4 and 8 with centrally located bond pads that are electrically bonded to the same surface of a single lead frame. Further, the present invention provides a TSOP semiconductor device assembly that may be produced and handled with existing equipment and used in existing electronic devices without requiring reconfiguration thereof. As an additional advantage, heat dissipation away from the semiconductor dice may be enhanced by way of the lead frame 14 positioned between first semiconductor die 4 and second semiconductor die 8.

Figure 2:
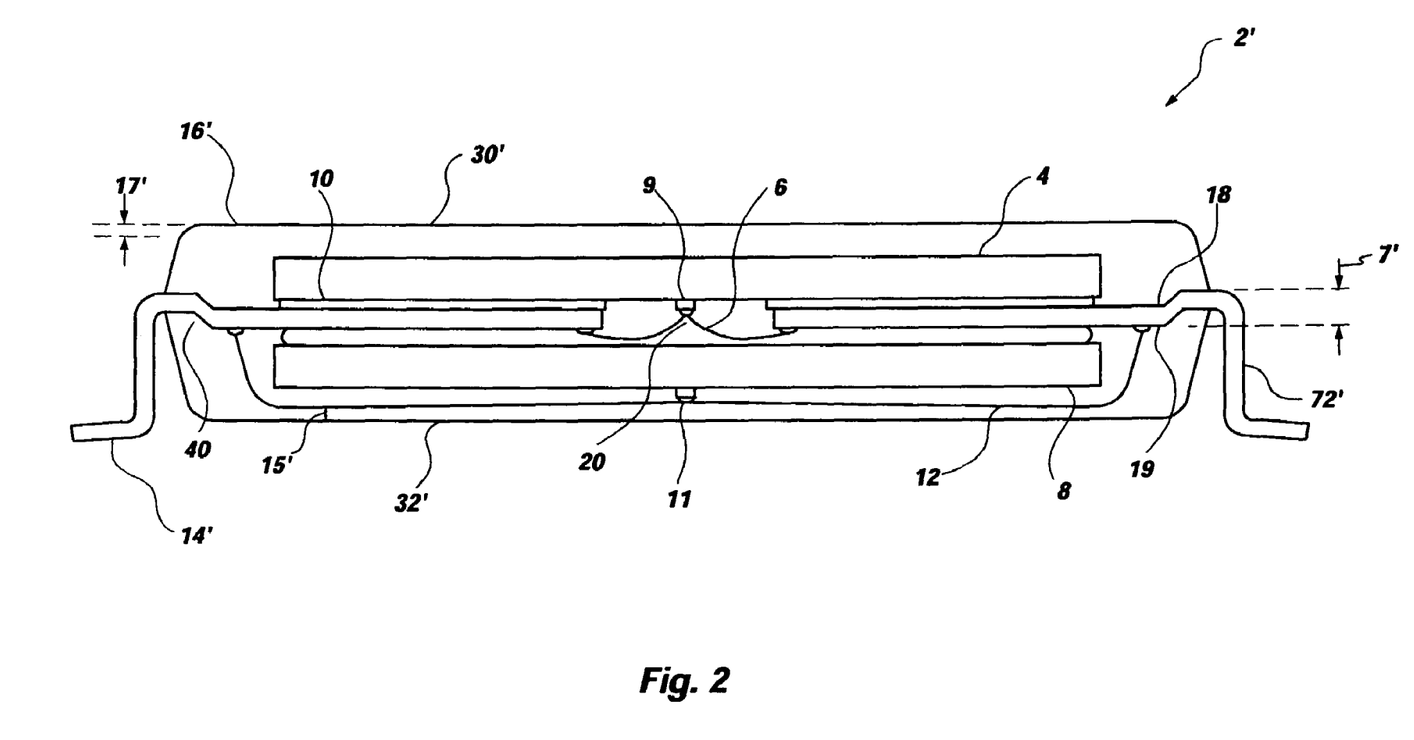
FIG. 2 is a simplified cross-sectional view illustrating a variation of the embodiment of a packaged, dual, centrally bonded TSOP semiconductor die assembly shown in FIG. 1, with lead fingers that include downsets.

A second embodiment of a TSOP semiconductor die package 2' of the present invention is shown in FIG. 2, wherein the lead frame 14' includes a vertical bend or downset 40 that adjusts the lead frame 14' to adjust the position of the semiconductor die assembly within the dimensions of the encapsulant package 16'. More specifically, a conventional TSOP transfer mold for encapsulating the semiconductor die assembly may be used if a downset 40 is employed to maintain the conventional vertical position at which the lead frame 14' exits the encapsulation package 16' while accommodating the presence of two stacked semiconductor dice 4 and 8. The size 7' of the downset 40 may be adjusted to vertically position the upper surface of a first semiconductor die 4 and the electrical connection elements 12 of a second semiconductor die 8 between the upper surface 30' and the lower surface 32' of encapsulant package 16'. For instance, as discussed hereinabove, the upper encapsulant thickness 17' and lower encapsulant thickness 15' may be tailored depending on the marking requirements, or as otherwise desired.

As shown in FIG. 2, the TSOP semiconductor die package 2' may be assembled essentially as semiconductor die package 2 is assembled. First semiconductor die 4 is first attached to first surface 18 of the lead frame 14'. Then, electrical connections between the lead fingers 72' of the lead frame 14' and substantially centrally located bond pads 9 on first semiconductor die 4 are established by way of electrical connection elements 6.

Epoxy 20 may then be applied to locations of second surface 19 of lead frame 14' adjacent to bond pads 9, around electrical connection elements 6, and over the exposed surface of first semiconductor die 4, including the substantially centrally located bond pads 9 thereof. Second semiconductor die 8 may be affixed to first semiconductor die 4 by positioning second semiconductor die 8 onto the at least partially uncured epoxy 20, which may be cured, as known in the art (e.g., thermally, with a catalyst, by radiation of a particular type or wavelength, etc.), either before or after bond pads 11 of second semiconductor die 8 are electrically connected to corresponding lead fingers 72' of lead frame 14'. As shown, first and second semiconductor dice 4 and 8 are facing in substantially the same direction because both active surfaces of each first semiconductor die 4, 8 are facing downward. Alternative means to attach each die to each other as well as to the lead frame 14' may be employed, such as adhesive-coated tape 10 or other attachment means known in the art.

Substantially centrally located bond pads 11 of second semiconductor die 8 may be electrically connected to second surface 19 of corresponding lead fingers 72' of lead frame 14' by way of electrical connection elements 12. Specific to bond wires, if employed as electrical connection elements 12, stitch bonding may be utilized to stiffen or alter an electrical characteristic of the bond wires.

Upon fabrication of the previously described assembly of lead frame 14' with attached semiconductor dice 4 and 8, the assembly may be encapsulated, as described hereinabove. If epoxy 20 that secures second semiconductor die 8 to first semiconductor die 4 has not yet been fully cured, it may be cured as the encapsulant material is cured (e.g., by heat and/or pressure, etc.). However, assuming identical molds are used for both embodiments, the upper encapsulant thickness 17' in semiconductor die package 2' may be increased by way of downset 40, as compared to the upper encapsulant thickness 17 of semiconductor die package 2 (FIG. 1).

Upon encapsulation, semiconductor die package 2' may exhibit substantially the same size as a typical single die TSOP and, thus, may be produced and handled with existing equipment for use with TSOPs.

Encapsulant package 16' may be marked on the outer surface by way of laser marking. Again, in order to avoid damaging the die assembly, the upper encapsulant thickness 17' and/or lower encapsulant thickness 15' should accommodate laser marking if laser marking is intended for that surface.

Figure 3:
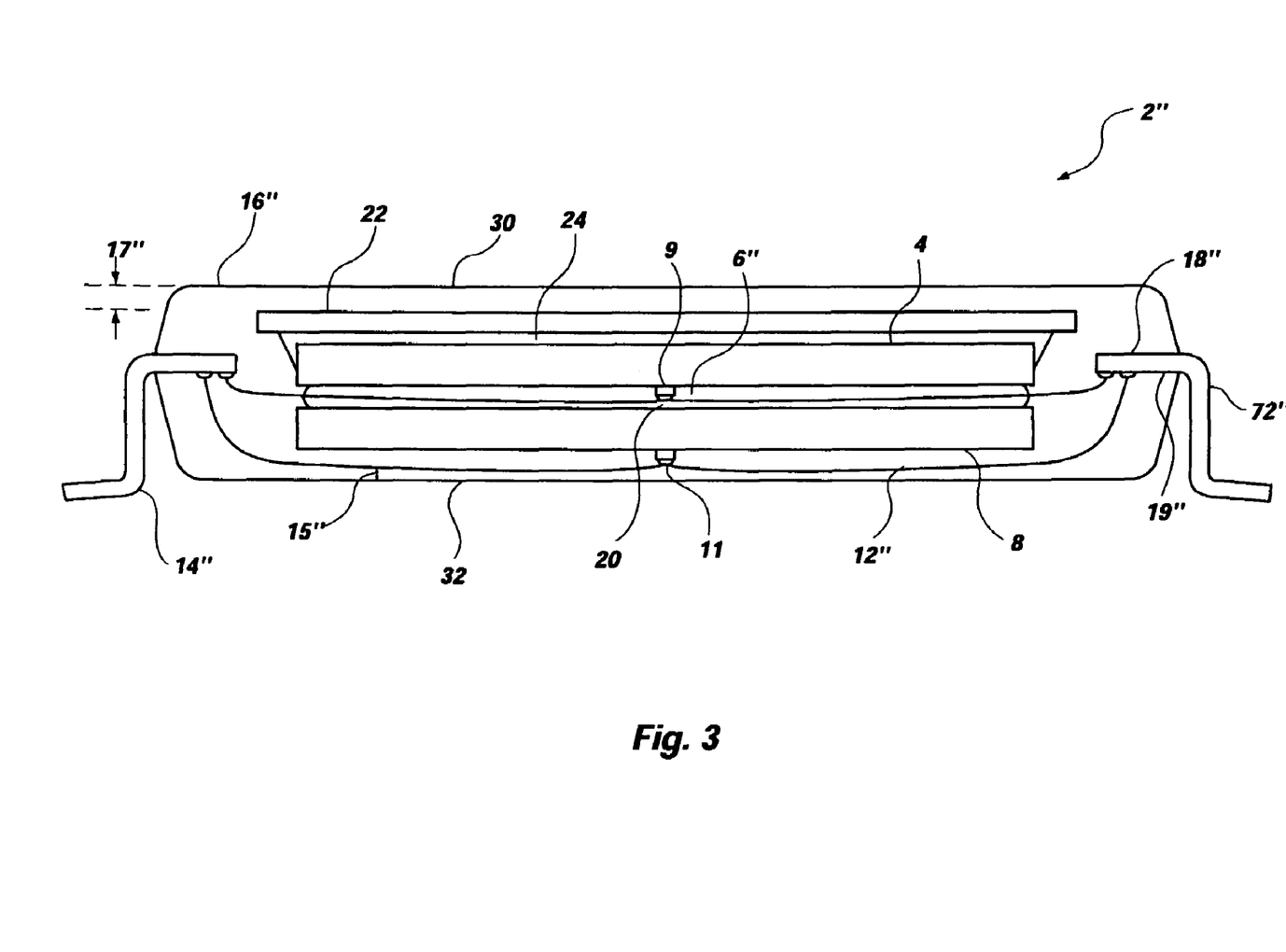
FIG. 3 is a simplified cross-sectional view illustrating an embodiment of a packaged, dual, centrally bonded TSOP semiconductor die assembly according to the present invention that includes a conventional lead frame with a die paddle and two semiconductor dice that are stacked onto the die paddle with active surfaces thereof, which include centrally located bond pads, facing in the same direction.

Moving to FIG. 3, yet another embodiment of semiconductor die package 2" of the present invention is shown. Semiconductor die package 2" includes a lead frame 14" that does not interpose between the first and second semiconductor dice 4 and 8. A die paddle 22 of lead frame 14" supports first semiconductor die 4. Semiconductor die package 2" includes two semiconductor dice 4 and 8, each of which is electrically connected to a second surface 19" of the lead frame 14", which also has an opposite first surface 18". Second surface 19" of lead frame 14" may be plated to enhance bonding of the electrical connection elements 6", 12" to the lead frame 14". Specifically, electrical connection elements 6" from the substantially centrally located bond pads 9 of first semiconductor die 4 extend outwardly and beyond the lateral extent of first semiconductor die 4 and are attached to second surface 19" of corresponding lead fingers 72" of lead frame 14", as is known in the art. Second semiconductor die 8 is positioned over first semiconductor die 4 and electrical connection elements 6" that are secured to bond pads 9 thereof. Electrical connection elements 12" extend laterally outwardly and beyond the lateral extent of second semiconductor die 8 from the substantially centrally located bond pads 11 thereof to second surface 19" of corresponding lead fingers 72" of lead frame 14.

Electrical connection elements 6" and 12" may be tailored in order to substantially equalize an electrical characteristic between any desired electrical connection elements within TSOP semiconductor die package 2". More specifically, although FIG. 3 shows that electrical connection elements 12" may be attached to lead fingers 72" of the lead frame 14" at a more distant lateral position than electrical connection elements 6", alternatives are contemplated. For instance, electrical connection elements 6" may be attached at a more distant lateral position than electrical connection elements 12" in order to substantially equalize the lengths thereof and, thereby, substantially equalize their electrical characteristics.

Still referring to FIG. 3, semiconductor die package 2" may be assembled similarly to the aforementioned embodiments. However, in this embodiment, first semiconductor die 4 would first be attached to die paddle 22 by way of epoxy 24, silver solder or another suitable attachment structure. Then, the lead fingers 72" of the lead frame 14" and corresponding, substantially centrally located bond pads 9 of first semiconductor die 4 may be electrically connected by positioning electrical connection elements 6" therebetween, as is known in the art. Further, since electrical connection elements 6" are relatively long, if bond wires are used, stitch bonding may be utilized. Alternatively, substantially centrally located bond pads 9 of first semiconductor die 4 may be attached to second surface 19" of lead fingers 72" by way of TAB elements or other connection means.

Epoxy 20 may then be applied to second surface 19" of lead frame 14", around electrical connection elements 6", and over the exposed surface of first semiconductor die 4, including substantially centrally located bond pads 9 thereof. Second semiconductor die 8 may be affixed to first semiconductor die 4 by positioning second semiconductor die 8 onto the at least partially uncured epoxy 20, or by other attachment means known in the art. As in the aforementioned embodiments, both semiconductor dice 4 and 8 face in substantially the same direction.

Bond pads 11 of second semiconductor die 8 may then be electrically connected to the second surface 19" of corresponding lead fingers 72" of lead frame 14" by way of electrical connection elements 12" therebetween. Bond wires, TAB elements, or other attachment means as known in the art may be utilized to form electrical connection elements 12". Specific to bond wires, stitch bonding may be desired for relatively long bond wires that may be formed between second semiconductor die 8 and lead fingers 72".

Upon fabrication of the above-described assembly of lead frame 14" with attached semiconductor dice 4 and 8, the assembly may be encapsulated, as described hereinabove. As shown in FIG. 3, the encapsulation process covers the active surface of second semiconductor die 8, a portion of electrical connection elements 6" and electrical connection elements 12".

Upon encapsulation, semiconductor die package 2" may be substantially the same size as a typical single die TSOP assembly and, thus, may be produced and handled with existing equipment for use with TSOPs. Further, encapsulant package 16" may be marked on its outer surface by way of laser marking. In order to avoid damaging the die assembly, the upper encapsulant thickness 17" (see FIG. 3) and/or lower encapsulant thickness 15" should be sufficient to accommodate such laser marking if laser marking is intended for the corresponding surface 30, 32.

Figure 4:
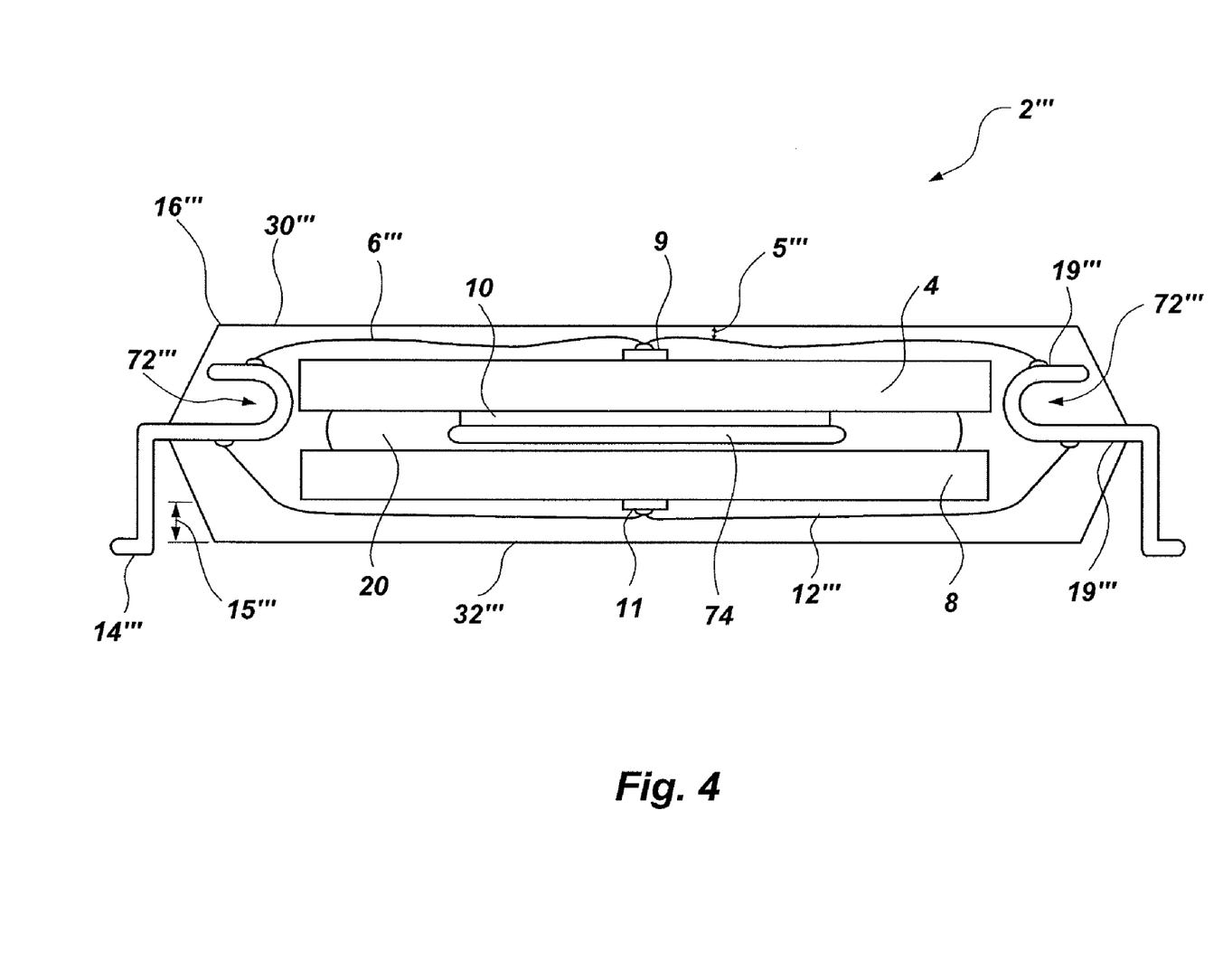
FIG. 4 is a simplified cross-sectional view illustrating an embodiment of a packaged, dual, centrally bonded TSOP semiconductor die assembly according to the present invention that includes a lead frame with a die paddle and lead fingers that are bent in such a way as to facilitate electrical connection to bond pads of two semiconductor dice that are secured to the die paddle and that include active surfaces that face in opposite directions.

FIG. 4 shows a semiconductor die package 2'" of the present invention in a fourth embodiment utilizing a lead frame 14'" wherein semiconductor dice 4 and 8 are oriented with their active surfaces facing opposite directions, with semiconductor dice 4 and 8 positioned back-to-back. As mentioned hereinabove, second surface 19'" of lead frame 14'" may be plated to enhance bonding of electrical connection elements 6'" and 12'" to the lead frame 14'". Electrical connection elements 6'" from the substantially centrally located bond pads 9 of first semiconductor die 4 extend outwardly and beyond the lateral extent of first semiconductor die 4 and are attached to second surface 19'" of corresponding lead fingers 72'" of lead frame 14'", as is known in the art. Likewise, electrical connection elements 12'" extend laterally outwardly and beyond the lateral extent of second semiconductor die 8 from the substantially centrally located bond pads 11 to electrically connect the second semiconductor die 8 to second surface 19'" of corresponding lead fingers 72'" of lead frame 14'".

Figure 8:
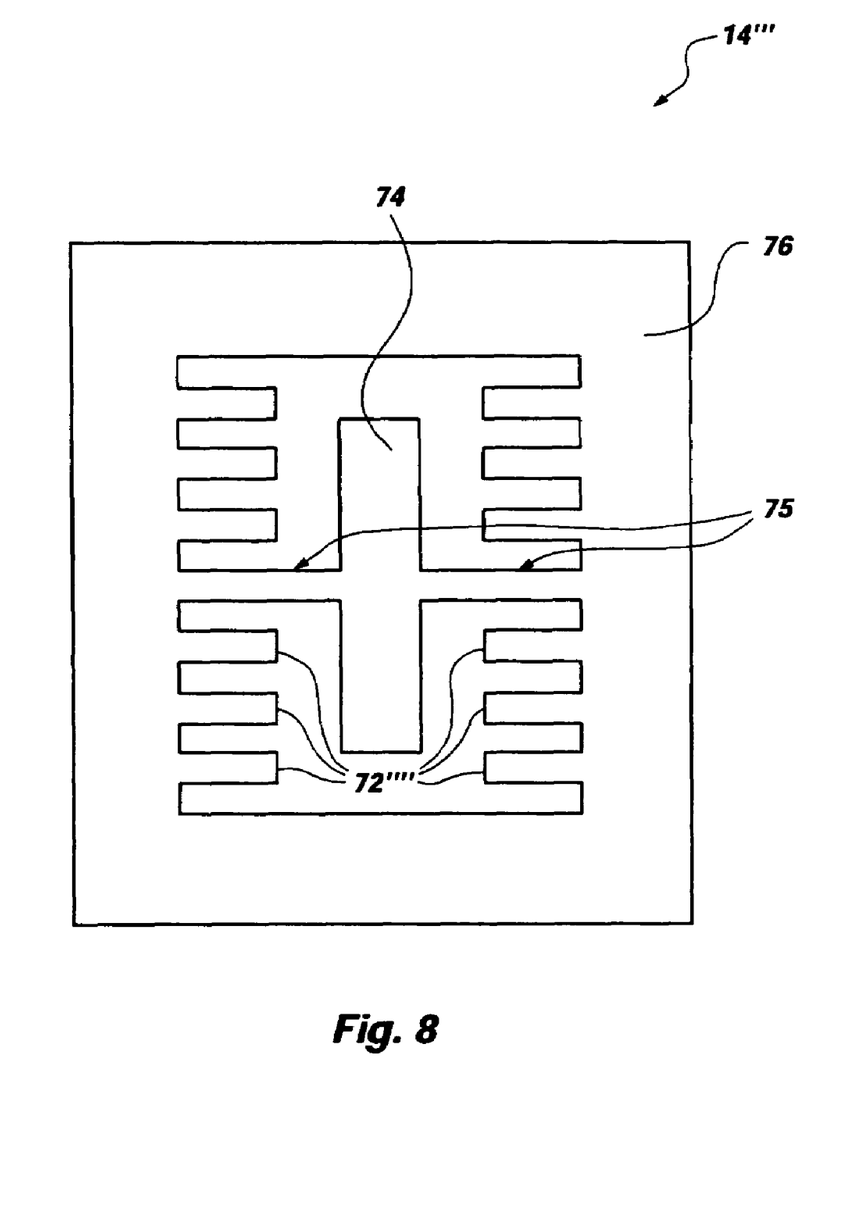
FIG. 8 is a simplified top view illustrating an embodiment of a lead frame depicted in FIG. 4.

Referring now to FIG. 4 and FIG. 8, semiconductor die package 2'" may be assembled similarly to the aforementioned embodiments. In this embodiment, first semiconductor die 4 is positioned on die paddle 74 of the lead frame 14'". Lead fingers 72'" of lead frame 14'" are connected to the outer periphery 76 of lead frame 14'". In addition, die paddle 74 is connected to the outer periphery 76 by way of die paddle struts 75. A top view of lead frame 14'" is shown in FIG. 8, prior to die assembly. Further, prior to die assembly, a second surface 19'" of the lead frame 14'" may be plated to enhance bonding characteristics thereto. Also, prior to die assembly, lead fingers 72'" are bent in order to facilitate the formation or positioning of electrical connection elements 6'", 12'" between bond pads 9, 11 of semiconductor dice 4 and 8, respectively, and second surface 19'" of lead fingers 72'" of lead frame 14'", as shown in the cross-sectional view of FIG. 4. After encapsulation of the die assembly, the package will be trimmed from the outer periphery 76 (see FIG. 8) to form individual fingers associated with respective, substantially centrally located bond pads of each semiconductor die 4, 8.

First semiconductor die 4 may be affixed to die paddle 74 (see FIG. 8) by way of adhesive-coated tape 10, epoxy, or other means known in the art. Once first semiconductor die 4 is so positioned, lead fingers 72'" of the lead frame 14'" and substantially centrally located bond pads 9 of first semiconductor die 4 are electrically connected by way of electrical connection elements 6'". Electrical connection elements 6'" from the substantially centrally located bond pads 9 of first semiconductor die 4 extend outwardly and beyond the lateral extent of first semiconductor die 4 and may be attached to second surface 19'" of lead frame 14'", as is known in the art. Further, if electrical connection elements 6'" comprise bond wires, stitch bonding may be utilized. Alternatively, substantially centrally located bond pads 9 of first semiconductor die 4 may be attached to second surface 19'" of lead frame 14'" by way of TAB connections or other connection means.

Epoxy 20 may then be applied to the opposite surface of die paddle 74, which surface does not have first semiconductor die 4 affixed thereto, as well as to the remaining exposed back surface of first semiconductor die 4. Second semiconductor die 8 may be secured to first semiconductor die 4 and to die paddle 74 by positioning second semiconductor die 8 onto at least partially uncured epoxy 20, or by other attachment means known in the art.

Electrical connection elements 12'" may be positioned or formed between the substantially centrally located bond pads 11 of second semiconductor die 8 and surface 19'" of corresponding lead fingers 72'" of lead frame 14'". As mentioned hereinbefore, specific to bond wires, stitch bonding may be desired.

Notably, the bent shapes of lead fingers 72'" (as shown in FIG. 4), which orient portions of second surface 19'" thereof in the same directions as those in which the active surfaces of adjacent semiconductor devices 4 and 8 are oriented, facilitate the attachment of electrical connection elements 6'" and electrical connection elements 12'" to the same second surface 19'" of the lead frame 14'". Second surface 19'" may likewise be twisted, formed, or otherwise distorted in any other suitable manner to facilitate the attachment of electrical connection elements thereto from semiconductor dice that are arranged in back-to-back relation or any other fashion. As such, if the lead frame 14'" includes a plated second surface 19'" to enhance electrical connection attachment thereto, only one second surface 19'" need be plated, thus reducing processing costs and complexity.

In addition, the electrical connection elements 6'" and 12'" may be tailored to substantially equalize electrical characteristics therebetween. For instance, and more specifically, the lateral connection position to the lead frame 14'" may be tailored in this embodiment such that electrical connection elements 6'" and 12'" may have substantially the same lengths, providing them with substantially equalized electrical characteristics. Stitch bonding may also be used to tailor an electrical characteristic of bond wires. Specifically, the bond wire path may be tailored to selectively modify an electrical characteristic thereof. Length may be tailored, or specific geometric features of the bond wire path may be created, such as coils.

Upon fabrication of the previously described assembly of lead frame 14'" with attached semiconductor dice 4 and 8, the assembly may be encapsulated, as described hereinabove. The active surface of first semiconductor die 4 and the active surface of second semiconductor die 8 and electrical connection elements 6'" and 12'" may be contained within encapsulant package 16'".

Encapsulation provides a semiconductor die package 2'" that may be substantially the same size as a typical single die TSOP and, therefore, may be manufactured and handled using existing equipment. Further, encapsulant package 16'" may be marked on its outer surface 30'", 32'" by way of laser marking. In order to avoid damaging the die assembly, the upper encapsulant thickness 5'" between electrical connection elements 6'" and the upper surface 30'" of encapsulant package 16'" should be sufficient to accommodate such laser marking. Likewise, lower encapsulant thickness 15'" may be adequate to protect the die assembly and to accommodate any laser marking if laser marking is intended for that surface.

Figure 5:
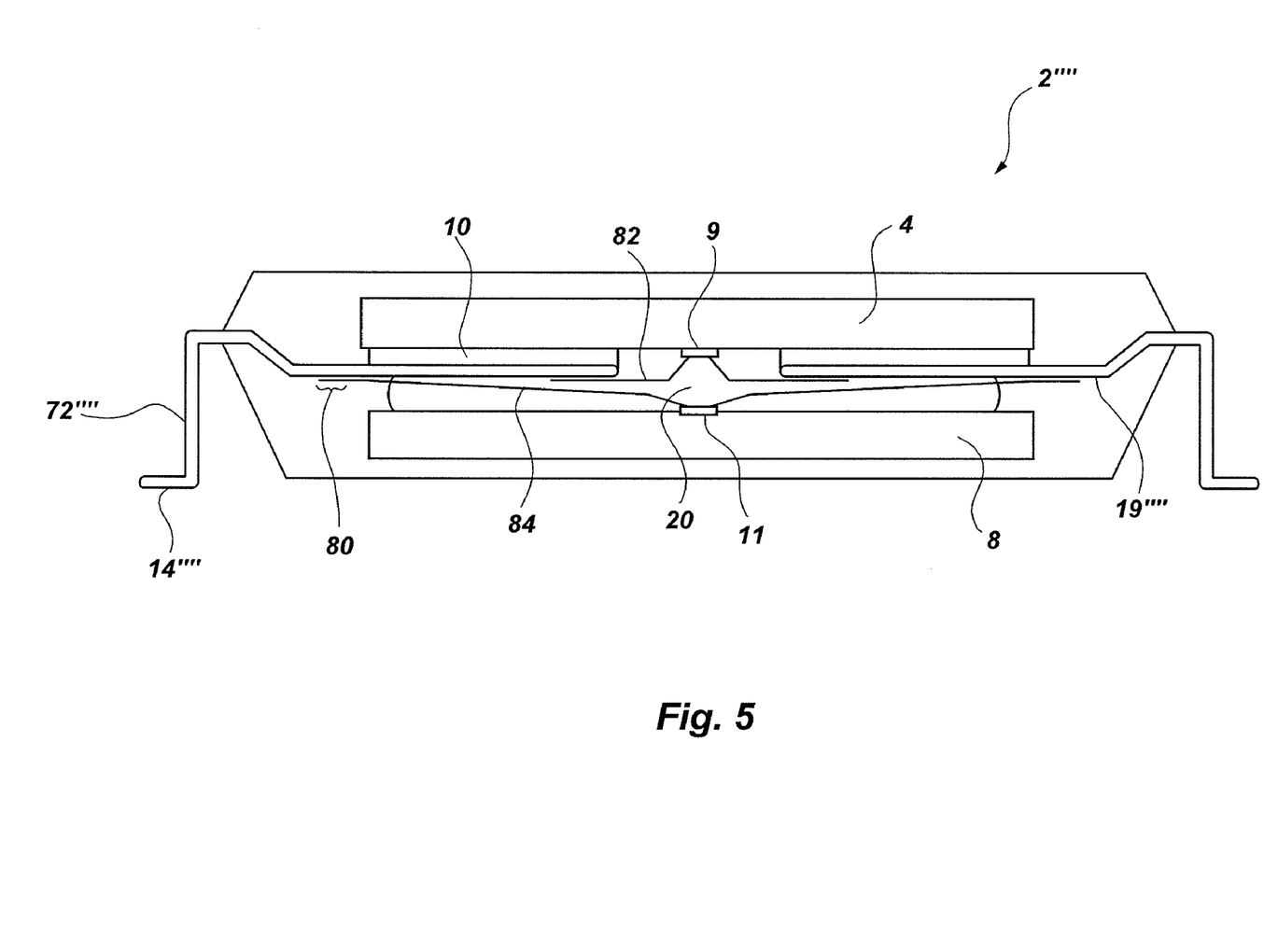
FIG. 5 is a simplified cross-sectional view illustrating an embodiment of a packaged, dual, centrally bonded TSOP semiconductor die assembly according to the present invention that includes an LOC-type lead frame interposed between two semiconductor dice with active surfaces that face each other.

Now referring to FIG. 5, still another embodiment of semiconductor die package 2"" of the present invention is shown, wherein a first semiconductor die 4 and a second semiconductor die 8 are oriented such that the active surfaces of the dice are facing one another. Electrical connection elements 82 from the substantially centrally located bond pads 9 of first semiconductor die 4 extend laterally and are attached to second surface 19"" of lead frame 14"", as is known in the art. In addition, electrical connection elements 84 extend from substantially centrally located bond pads 11 of second semiconductor die 8 laterally outwardly and beyond the lateral extent of second semiconductor die 8 and are attached to the same second surface 19'''' of lead frame 14'''', as is known in the art.

Semiconductor die package 2'''' may be assembled as follows. First semiconductor die 4 may be affixed to lead frame 14'''' by way of adhesive-coated tape 10, epoxy, or other affixation means known in the art. Electrical connection elements 82 extend between substantially centrally located bond pads 9 of first semiconductor die 4 and corresponding leads 72'''' of lead frame 14'''' and provide electrical paths therebetween. As mentioned hereinabove, electrical connection elements 82 from the substantially centrally located bond pads 9 of first semiconductor die 4 are attached to lead frame 14''''. However, in this embodiment, electrical connection elements 84 may be TAB-type connections, or other electrical connections that may be formed and connected to the plurality of substantially centrally located bond pads 11 while remaining unconnected to the lead frame 14''''. After electrical connection elements 84 are connected to substantially centrally located bond pads 11 of second semiconductor die 8, second semiconductor die 8 may be secured to the lead frame 14'''' and/or first semiconductor die 4, as desired. FIG. 5 shows epoxy 20 may be used to affix second semiconductor die 8 to both the lead frame 14'''' and the exposed surface of first semiconductor die 4. In addition, epoxy 20 may encapsulate electrical connection elements 82 and substantially centrally located bond pads 9 of first semiconductor die 4.

Once first and second semiconductor dice 4 and 8 have been secured to the lead frame 14'''' or to one another, the laterally distal ends 80 of electrical connection elements 84 may be attached to second surface 19'''' of the lead frame 14'''', which may be plated to enhance bonding of the electrical connection elements 84 to the lead frame 14'''' at a lateral position that is external to the lateral extent of the epoxy 20, or other adhesive means used. Therefore, the attachment sites may not necessarily extend beyond the lateral extent of either first semiconductor die 4 or second semiconductor die 8. However, FIG. 5 shows an embodiment where the external connection sites to lead frame 14'''' are formed beyond the lateral extent of second semiconductor die 8 at the laterally distal ends 80 of electrical connection elements 84.

Because the lead frame 14'''' may be positioned between first semiconductor die 4 and second semiconductor die 8, heat dissipation away from the semiconductor dice may be enhanced. Also, the present embodiment facilitates substantial equalization of an electrical characteristic of electrical connection elements 82 and 84. As an example, the electrical connection elements 82 and 84 may be tailored to substantially the same overall length, thus substantially equalizing the electrical characteristics thereof. More specifically, the lateral connection position to the lead frame 14'''' of each set of electrical connection elements may be tailored in this embodiment to provide a substantially equalized electrical characteristic by way of equalizing the length of individual electrical connection elements.

While the present invention has been disclosed in terms of an exemplary embodiment and variations thereof, those of ordinary skill in the art will recognize and appreciate that the invention is not so limited. Those of ordinary skill in the art will recognize and appreciate that many additions, deletions and modifications to the disclosed embodiment and its variations may be implemented without departing from the scope of the invention, which is limited only by the appended claims and their legal equivalents.

What is claimed is:

1. A semiconductor device assembly, comprising:
   a first semiconductor die including a centerline extending along a length of the first semiconductor die and bond pads aligned adjacent to or along the centerline;
   a second semiconductor die including a centerline extending along a length of the second semiconductor die and bond pads aligned adjacent to or along the centerline;
   a plurality of leads including opposite major surfaces, with only a single surface including plating to facilitate electrical connection thereto, a surface of each lead of the plurality including the plating;
   a plurality of electrical connection elements, every electrical connection element of the semiconductor device assembly extending between a bond pad of one of the first and second semiconductor dice and the plating on the single surface of a corresponding lead of the plurality of leads; and
   a molded encapsulant covering the first and second semiconductor dice and encapsulating the plurality of electrical connection elements.

2. The semiconductor device assembly of claim 1, wherein each electrical connection element of the plurality of electrical connection elements is secured to the plating.

3. The semiconductor device assembly of claim 1, wherein at least some of the plurality of electrical connection elements comprise bond wires.

4. The semiconductor device assembly of claim 3, wherein the bond wires comprise stitch bonds.

5. The semiconductor device assembly of claim 1, wherein at least some of the leads of the plurality of leads extend over a surface of the first semiconductor die.

6. The semiconductor device assembly of claim 5, wherein electrical connection elements of the plurality of electrical connection elements that connect bond pads of the first semiconductor die to corresponding leads of the plurality of leads are secured to locations of the corresponding leads that are proximate to the bond pads.

7. The semiconductor device assembly of claim 6, wherein electrical connection elements of the plurality of electrical connection elements that connect bond pads of the second semiconductor die to corresponding leads of the plurality of leads extend beyond an outer periphery of the second semiconductor die.

8. The semiconductor device assembly of claim 1, wherein each electrical connection element of the plurality of electrical connection elements extends beyond an outer periphery of at least one of the first and second semiconductor dice.

9. The semiconductor device assembly of claim 1, wherein the corresponding leads of the plurality of leads comprise downsets.

10. The semiconductor device assembly of claim 9, wherein the downsets position the first and second semiconductor dice relative to a plane in which outer ends of the corresponding leads are located.

11. The semiconductor device assembly of claim 10, further comprising a packaging material covering at least portions of the first and second semiconductor dice and portions of the plurality of leads adjacent thereto.

12. The semiconductor device assembly of claim 11, wherein the downsets are configured to impart the semiconductor device assembly with dimensions that are substantially the same as those of a standard thin small outline package.

13. The semiconductor device assembly of claim 1, further comprising adhesive material.

14. The semiconductor device assembly of claim 13, wherein the adhesive material secures the second semiconductor die to at least one of the first semiconductor die and the plurality of leads.

15. The semiconductor device assembly of claim 14, wherein the adhesive material substantially encapsulates electrical connection elements of the plurality of electrical connection elements that connect the bond pads of the first semiconductor die to corresponding leads of the plurality of leads.

16. The semiconductor device assembly of claim 1, wherein the first and second semiconductor dice are oriented such that an active surface of the first semiconductor die faces in substantially the same direction as an active surface of the second semiconductor die.

17. The semiconductor device assembly of claim 1, wherein the first and second semiconductor dice are oriented such that active surfaces thereof face one another.

18. The semiconductor device assembly of claim 1, wherein the first and second semiconductor dice are oriented in backside-to-backside relation.

19. The semiconductor device assembly of claim 1, wherein the plurality of electrical connection elements have substantially the same lengths as one another.

20. The semiconductor device assembly of claim 19, wherein the plurality of electrical connection elements have substantially the same electrical characteristic as one another.

21. The semiconductor device assembly of claim 1, wherein inner portions of the corresponding leads of the plurality of leads are bent such that a first region of the single surface of each lead faces in an opposite direction from a second region of the single surface thereof.

22. The semiconductor device assembly of claim 1, further comprising:
    a packaging material covering at least portions of the first and second semiconductor dice and portions of the plurality of leads located adjacent thereto.

23. A semiconductor device assembly, comprising:
    first and second semiconductor dice including bond pads arranged in identical connection patterns;
    a plurality of leads comprising opposite major surfaces, only one surface of each lead of the plurality including plating to facilitate electrical connection;
    a plurality of electrical connection elements between bond pads of the first and second semiconductor dice and the plating on the one surface of each lead of the plurality of leads; and
    a molded encapsulant covering the first and second semiconductor dice and encapsulating the plurality of electrical connection elements.

24. The semiconductor device assembly of claim 23, wherein each electrical connection element of the plurality of electrical connection elements is secured to the plating.

25. The semiconductor device assembly of claim 23, wherein at least some of the plurality of electrical connection elements comprise bond wires.

26. The semiconductor device assembly of claim 25, wherein the bond wires comprise stitch bonds.

27. The semiconductor device assembly of claim 23, wherein at least some of the leads of the plurality of leads extend over a surface of the first semiconductor die.

28. The semiconductor device assembly of claim 23, wherein the bond pads of the first and second semiconductor dice are peripherally located.

29. The semiconductor device assembly of claim 28, wherein each electrical connection element of the plurality of electrical connection elements extends beyond outer peripheries of the first and second semiconductor dice.

30. The semiconductor device assembly of claim 23, wherein the bond pads of the first and second semiconductor dice are substantially centrally located.

31. The semiconductor device assembly of claim 30, wherein electrical connection elements of the plurality of electrical connection elements that connect bond pads of the first semiconductor die to corresponding leads of the plurality of leads are secured to locations of the corresponding leads that are proximate to the bond pads.

32. The semiconductor device assembly of claim 31, wherein electrical connection elements of the plurality of electrical connection elements that connect bond pads of the second semiconductor die to corresponding leads of the plurality of leads extend beyond an outer periphery of the second semiconductor die.

33. The semiconductor device assembly of claim 23, wherein each electrical connection element of the plurality of electrical connection elements extends beyond an outer periphery of at least one of the first and second semiconductor dice.

34. The semiconductor device assembly of claim 23, wherein the leads of the plurality of leads comprise downsets.

35. The semiconductor device assembly of claim 34, wherein the downsets position the first and second semiconductor dice relative to a plane in which outer ends of the leads are located.

36. The semiconductor device assembly of claim 35, further comprising:
    a packaging material covering at least portions of the first and second semiconductor dice and portions of the plurality of leads adjacent thereto.

37. The semiconductor device assembly of claim 36, wherein the downsets are configured to impart the semiconductor device assembly with dimensions that are substantially the same as those of a standard thin small outline package.

38. The semiconductor device assembly of claim 23, further comprising adhesive material.

39. The semiconductor device assembly of claim 38, wherein the adhesive material secures the second semiconductor die to at least one of the first semiconductor die and the plurality of leads.

40. The semiconductor device assembly of claim 39, wherein the adhesive material substantially encapsulates electrical connection elements of the plurality of electrical connection elements that connect the bond pads of the first semiconductor die to corresponding leads of the plurality of leads.

41. The semiconductor device assembly of claim 23, wherein the first and second semiconductor dice are oriented such that an active surface of the first semiconductor die faces in substantially the same direction as an active surface of the second semiconductor die.

42. The semiconductor device assembly of claim 23, wherein the first and second semiconductor dice are oriented such that active surfaces thereof face one another.

43. The semiconductor device assembly of claim 23, wherein the first and second semiconductor dice are oriented in backside-to-backside relation.

44. The semiconductor device assembly of claim 23, wherein the plurality of electrical connection elements have substantially the same lengths as one another.

45. The semiconductor device assembly of claim 44, wherein the plurality of electrical connection elements have substantially the same electrical characteristic as one another.

46. The semiconductor device assembly of claim 23, wherein inner portions of the leads of the plurality of leads are bent such that a first region of the one surface of each lead faces in an opposite direction from a second region of the one surface thereof.

47. The semiconductor device assembly of claim 23, further comprising:
a packaging material covering at least portions of the first and second semiconductor dice and portions of the plurality of leads located adjacent thereto.

48. The semiconductor device assembly of claim 1, wherein the molded encapsulant has a thickness of about one millimeter or less.

49. The semiconductor device assembly of claim 48, wherein portions of the molded encapsulant extending over oppositely facing outer surfaces of an assembly including the first and second semiconductor dice have thicknesses of at least about 0.185 mm.

50. The semiconductor device assembly of claim 48, wherein the first and second semiconductor dice have thicknesses of about 0.2 mm or less.

51. The semiconductor device assembly of claim 1, wherein each conductive element of the plurality of conductive elements is located entirely over a surface of one of the first and second semiconductor dice.

52. The semiconductor device assembly of claim 23, wherein the molded encapsulant has a thickness of about one millimeter or less.

53. The semiconductor device assembly of claim 52, wherein portions of the molded encapsulant extending over oppositely facing outer surfaces of an assembly including the first and second semiconductor dice have thicknesses of at least about 0.185 mm.

54. The semiconductor device assembly of claim 52, wherein the first and second semiconductor dice have thicknesses of about 0.2 mm or less.

55. The semiconductor device assembly of claim 23, wherein each conductive element of the plurality of conductive elements is located entirely over a surface of one of the first and second semiconductor dice.

* * * * *